United States Patent [19]

Kondo et al.

[11] Patent Number: 5,271,028

[45] Date of Patent: Dec. 14, 1993

[54] SEMICONDUCTOR LASER DEVICE

[75] Inventors: Masafumi Kondo, Nara; Takahiro Suyama, Yamatokoriyama; Shinji Kaneiwa; Toshio Hata, both of Nara; Hiroyuki Hosoba, Nara; Sadayoshi Matsui, Tenri, all of Japan

[73] Assignee: Sharp Kabushiki Kaisha, Osaka, Japan

[21] Appl. No.: 918,462

[22] Filed: Jul. 22, 1992

[30] Foreign Application Priority Data

Jul. 22, 1991 [JP] Japan ................... 3-181330

[51] Int. Cl.$^5$ .................................. H01S 3/19
[52] U.S. Cl. ............................ 372/46; 372/45
[58] Field of Search ......................... 372/46, 45

[56] References Cited

U.S. PATENT DOCUMENTS 4,785,457 11/1988 Asbeck et al. ............. 372/45
4,932,033 6/1990 Miyazawa ................ 372/46

FOREIGN PATENT DOCUMENTS 0097887 6/1983 Japan ................... 372/46
0239080 11/1985 Japan ................... 372/46
0239081 11/1985 Japan ................... 372/46
1-108789 4/1989 Japan .
0048669 2/1992 Japan ................... 372/46
0113685 4/1992 Japan ................... 372/46
0163982 6/1992 Japan ................... 372/46

OTHER PUBLICATIONS

Wang, W. I., et al., "Crystal orientation dependence of silicon doping in molecular beam epitaxial AlGaAs/GaAs heterostructures", *Applied Physics Letters* (Oct. 15, 1985) 47(8):826-828.
Imamoto, H., et al., *Extended Abstracts* (*The 34th Spring Meeting, 1987*) The Japan Society of Applied Physics and Related Societies, p. 204, 31p-ZA-4, article entitled: "Inner-Striped Laser Diode by a Novel Single Step MBE".
Kobayashi, K., *Patent Abstracts of Japan* (4 Feb. 1986) vol. 10, No. 27, (E-378) [2084]. The corresponding Japanese Patent Publication No. 60-187083 is also enclosed.
Masafumi et al., *Patent Abstracts of Japan* (7 Aug. 1989) vol. 13, No. 350, (E-800). The corresponding Japanese Patent Publication No. 1-109786 is also enclosed.
Toshiro et al., *Patent Abstracts of Japan* (31 Oct. 1988) vol. 12, No. 412, (E-676). The corresponding Japanese Patent Publication No. 63-150985 is also enclosed.
Mihashi, Y., *Patent Abstracts of Japan* (21 Dec. 1984) vol. 8, No. 281, (E-286). The corresponding Japanese Patent Publication No. 59-149079 is also enclosed.
Blauvelt et al., "Narrow stripe AlGaAs lasers using double current confinement" *Applied Physics Letters* (1982) 41(10):903-905.
Ueno, S., *Patent Abstracts of Japan* (12 Apr. 1986) vol. 10, No. 95, (E-395). The corresponding Japanese Patent Publication No. 60-239080 is also enclosed.
Tomoyuki et al., *Patent Abstracts of Japan* (14 Aug. 1989) vol. 13, No. 364, (E-805). The corresponding Japanese Patent Publication No. 1-120083 is also enclosed.

*Primary Examiner*—Georgia Y. Epps
*Attorney, Agent, or Firm*—Morrison & Foerster

[57] ABSTRACT

A semiconductor laser device which can effectively confine electrons and positive holes is disclosed. The semiconductor laser device includes a semiconductor substrate of a first conductivity type, a current blocking layer of a second conductivity type, a first semiconductor layer of the first conductivity type made of a III-V group compound semiconductor, an active layer made of a III-V group compound semiconductor, and a second semiconductor layer. The semiconductor substrate has a ridge-type mesa having (n11)A planes. The current blocking layer is formed on the semiconductor substrate other than the top face of the mesa. The first semiconductor layer is formed on the entire surface of the current blocking layer and on the top face of the mesa. The active layer is formed on the first semiconductor layer. The second semiconductor layer is formed on the active layer. The second semiconductor layer has inclined portions, and is made of a III-V group compound semiconductor containing an amphoteric element as an impurity so that the inclined portions are of the first conductivity type and the other portions are of the second conductivity type.

7 Claims, 1 Drawing Sheet

SEMICONDUCTOR LASER DEVICE

BACKGROUND OF THE INVENTION

1. Field of the Invention

The present invention relates to a semiconductor laser device having a carrier-confining structure for confining the two types of carriers: electrons and positive holes.

2. Description of the Prior Art

In recent years, a semiconductor substrate with a growth plane other than the (100) plane has been employed for the growth of semiconductor crystals thereon by the use of molecular beam epitaxy. It has been found that silicon (Si), which serves as an n-type impurity in an AlGaAs layer grown on the (100) plane of a GaAs substrate, functions as a p-type impurity in an AlGaAs layer grown on the (n11) plane (where n is an integer equal to or greater than 1) of the GaAs substrate (Appl. Phys. Lett., 47, 826 (1985)). The cause for such inversion of the conductivity type is considered to be as follows: When a III-V group compound semiconductor layer (e.g., an AlGaAs layer such as mentioned above) is grown on the (n11) growth plane, the V group element of the III-V group compound semiconductor layer to be grown has a low sticking coefficient. Thus, when Si, a IV group amphoteric element, is added thereto as an impurity, it is readily taken into the lattice points for the V group element in the III-V group compound semiconductor layer. This causes the Si to function as an acceptor, i.e., a p-type impurity.

By utilizing the above-described phenomenon, both a current-confining structure and a refractive index waveguide structure can be formed in a single growth step using molecular beam epitaxy in the production of a semiconductor laser device (Japanese Laidopen Patent Publication No. 1-109789). A conventional semiconductor laser device of this type is shown in FIG. 2, which is produced, for example, as follows:

First, as shown in FIG. 2, a p-type GaAs substrate 30 with a ridge-type mesa 32 thereon is so prepared that the ridge-type mesa 32 has the (n11)A planes (where n is an integer equal to or greater than 1) as its inclined faces 31. On the surface of the p-type GaAs substrate 30 provided with the ridge-type mesa 32, a p-type AlGaAs first cladding layer 33, a non-doped GaAs active layer 34, and an n-type AlGaAs second cladding layer 35 are successively grown by molecular beam epitaxy. For the growth of the n-type AlGaAs second cladding layer 35, a IV group amphoteric element is added as an impurity. In the inclined portions of the n-type AlGaAs second cladding layer 35 located above the inclined faces 31 of the ridge-type mesa 32, the IV group amphoteric element added as an n-type impurity functions as a p-type impurity, so that these inclined portions become a p-type inversion layer 36. Other layers such as a contact layer and insulating film to be formed further on the n-type AlGaAs second cladding layer 35, and p-sided and n-sided electrodes are not shown in FIG. 2, and the description thereof is also omitted.

In the above-described conventional semiconductor laser device, current is confined by the p-type inversion layer 36.

However, in this semiconductor laser device, as shown in FIG. 2, reactive current flows through the p-type GaAs substrate 30, then through the p-type AlGaAs first cladding layer 33, then through the inclined portions 38 of the non-doped GaAs active layer 34 located under the p-type inversion layer 36, and then through the p-type inversion layer 36, and thereafter through a portion 37 of the n-type AlGaAs second cladding layer 35 located above the top face of the ridge-type mesa 32. Furthermore, in this semiconductor laser device, electrons with high mobility are confined by the p-type inversion layer 36, but positive holes with low mobility are not confined. This further increases the reactive current in the semiconductor laser device.

SUMMARY OF THE INVENTION

The semiconductor laser device of this invention comprises:

a semiconductor substrate of a first conductivity type provided with a ridge-type mesa on one surface thereof, the mesa having (n11)A planes (where n is an integer equal to or greater than 1) as its inclined faces;

a current blocking layer of a second conductivity type formed on the entire part of the one surface of the semiconductor substrate other than the top face of the mesa;

a first semiconductor layer of the first conductivity type formed from a III-V group compound semiconductor on the entire surface of the current blocking layer and on the top face of the mesa;

an active layer formed from a III-V group compound semiconductor on the entire surface of the first semiconductor layer; and a second semiconductor layer formed on the entire surface of the active layer, the second semiconductor layer having inclined portions located above the inclined faces of the mesa and being made of a III-V group compound semiconductor containing an amphoteric element as an impurity so that the inclined portions of the second semiconductor layer are of the first conductivity type and the other portions of the second semiconductor layer are of the second conductivity type.

Thus, the invention described herein makes possible the advantage of providing a semiconductor laser device which has a carrier-confining structure for confining both electrons with high mobility and positive holes with low mobility, thereby significantly reducing reactive current.

This and other advantages of the present invention will become apparent to those skilled in the art upon reading and understanding the following detailed description with reference to the accompanying figures.

DESCRIPTION OF THE PREFERRED EMBODIMENTS

Figure 1:
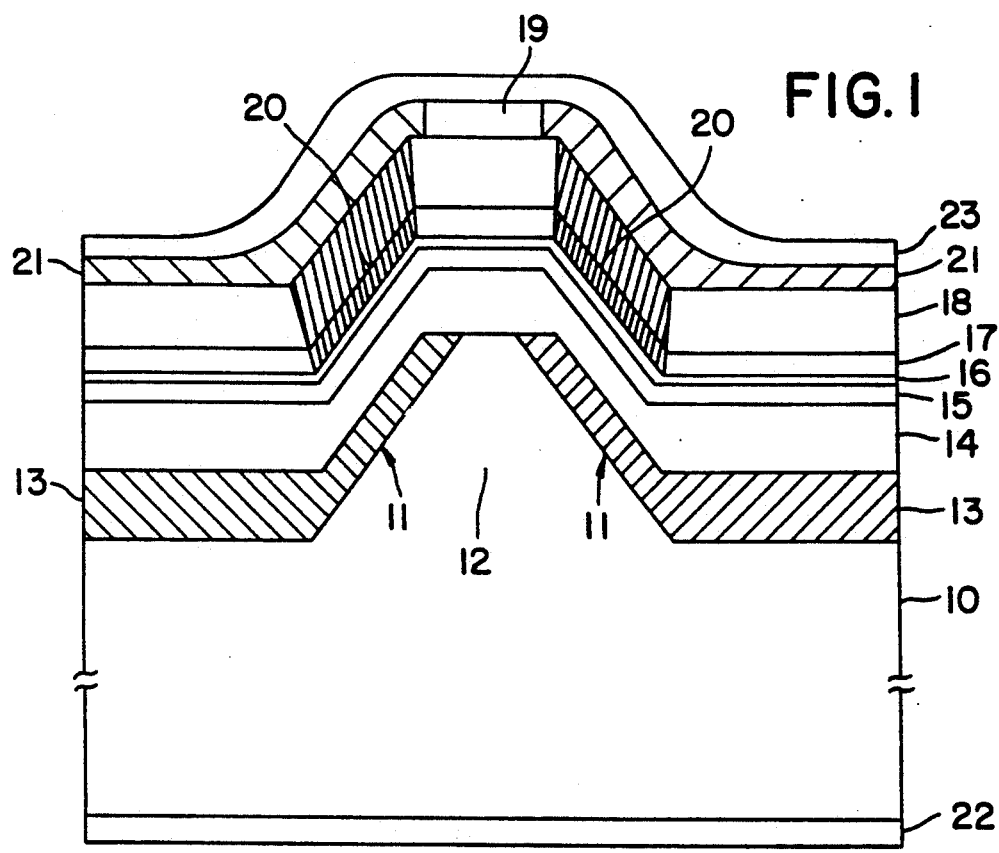
FIG. 1 is a sectional view of a semiconductor laser device according to the present invention.

A semiconductor laser device according to the present invention includes a semiconductor substrate of a first conductivity type with a ridge-type mesa thereon, a current blocking layer of a second conductivity type formed on the entire surface of the semiconductor substrate other than the top face of the ridge-type mesa, a first semiconductor layer formed on the current blocking layer and on the top face of the ridge-type mesa, an active layer formed on the first semiconductor layer, and a second semiconductor layer formed on the active layer. The ridge-type mesa has the (n11)A planes (where n is an integer equal to or greater than 1) as its inclined faces. As the material for the first semiconductor layer, active layer and second semiconductor layer, a III-V group compound semiconductor is used. The second semiconductor layer contains an amphoteric element as an impurity, so that the inclined portions of the second semiconductor layer located above the inclined faces of the ridge-type mesa serve as an inversion layer of the first conductivity type and the other portions of the second semiconductor layer are of the second conductivity type.

The semiconductor substrate and the current blocking layer can be made of a III-V group compound semiconductor or a IV group compound semiconductor such as that containing Si. Examples of the III-V group compound semiconductor used for the first semiconductor layer, active layer and second semiconductor layer include GaAs, AlGaAs, InP, GaInPAs, AlGaInAs, AlGaInP, and the like. Molecular beam epitaxy is employed for the growth of these three layers. For the growth of the current blocking layer of the second conductivity type, molecular beam epitaxy, metal organic chemical vapor deposition, or liquid phase epitaxy can be used.

As an impurity for the second semiconductor layer, any amphoteric element can be used as long as it functions as the impurity of the second conductivity type in a semiconductor layer grown on the growth plane corresponding to the (100) plane of the semiconductor substrate, and functions as an impurity of the first conductivity type in a semiconductor layer grown on the growth plane corresponding to the (n11)A plane (where n is an integer equal to or greater than 1) of the semiconductor substrate. For example, when the first conductivity type is the p type, silicon (Si) is used as the impurity. A IV group element other than Si, such as carbon (C) or germanium (Ge) can be also used as the impurity. In the growth of the second semiconductor layer, such an impurity is added in an appropriate amount.

It is preferable that the semiconductor layers of a GRIN (graded-index) structure (hereinafter referred to as a "GRIN layer") be provided between the active layer and the first semiconductor layer, and between the active layer and the second semiconductor layer. The presence of the GRIN layers substantially eliminates the abrupt change in energy at the interface between the active layer and the first semiconductor layer, and at the interface between the active layer and the second semiconductor layer. This causes electrons and positive holes to move more smoothly, and the laser beam to be confined in the active layer and the GRIN layers.

In the semiconductor laser device of the present invention, the inversion layer of the first conductivity type formed as the inclined portions of the second semiconductor layer mainly confines carriers of one type, while the current blocking layer of the second conductivity type formed on the semiconductor substrate of the first conductivity type mainly confines carriers of the other type. For example, when the inversion layer is of the p-type and the current blocking layer is of the n-type, the former confines electrons with high mobility and the latter confines positive holes with low mobility. In this manner, in the semiconductor laser device of the present invention, the two types of carriers, i.e., electrons and positive holes, are confined, so that reactive current can be greatly reduced.

The present invention will be further illustrated by reference to the following examples.

EXAMPLES

FIG. 1 shows a semiconductor laser device according to the present invention. This semiconductor laser device was produced as follows:

First, a p-type GaAs substrate 10 with the (100) growth plane having a ridge-type mesa 12 thereon was prepared with the addition of Zn as an impurity at a concentration of $1 \times 10^{19}$ cm$^{-3}$. The ridge-type mesa 12 was 3 μm in width along its top face and 1.5 μm in height, and had the (111)A planes as its inclined faces 11. On the entire surface of the p-type GaAs substrate 10 provided with the ridge-type mesa 12, an n-type GaAs current blocking layer 13 (500 nm thick; doped with Sn at a concentration of $3 \times 10^{18}$ cm$^{-3}$) was grown by using molecular beam epitaxy. Besides the molecular beam epitaxy (MBE), metal organic chemical vapor deposition (MOCVD) or liquid phase epitaxy (LPE) can be used for the growth of the n-type GaAs current blocking layer 13, with the addition of Se (when using MOCVD) or Te 13, (when using LPE) as the n-type impurity at a concentration of $3 \times 10^{18}$ cm$^{-3}$. Thereafter, the portion of the thus grown n-type GaAs current blocking layer 13 located on the top face of the ridge-type mesa 12 was removed by using photolithography and etching.

On the thus exposed top face of the ridgetype mesa 12 and on the entire surface of the n-type GaAs current blocking layer 13, a p-type Al$_{0.6}$Ga$_{0.4}$As first cladding layer 14 with a thickness of 250 nm, a p-type Al$_x$Ga$_{1-x}$As (x=0.6→0.2) first GRIN layer 15 with a thickness of 150 nm, a non-doped GaAs quantum-well active layer 16 with a thickness of 10 nm, an n-type Al$_x$Ga$_{1-x}$As (x=0.2→0.6) second GRIN layer 17 with a thickness of 150 nm, an n-type Al$_{0.6}$Ga$_{0.4}$As second cladding layer 18 with a thickness of 1 μm, and an n-type GaAs contact layer 19 with a thickness of 300 nm were successively grown in that order by molecular beam epitaxy. The p-type Al$_{0.6}$Ga$_{0.4}$As first cladding layer 14 and the p-type Al$_x$Ga$_{1-x}$As first GRIN layer 15 were doped with Be at concentrations of $1 \times 10^{18}$ cm$^{-3}$ and $1 \times 10^{17}$ cm$^{-3}$, respectively. The n-type Al$_x$Ga$_{1-x}$As second GRIN layer 17, the n-type Al$_{0.6}$Ga$_{0.4}$As second cladding layer 18 and the n-type GaAs contact layer 19 were doped with Si at concentrations of $1 \times 10^{17}$ cm$^{-3}$, $1 \times 10^{18}$ cm$^{-3}$ and $3 \times 10^{18}$ cm$^{-3}$, respectively. In the inclined portions of the n-type Al$_x$Ga$_{1-x}$As second GRIN layer 17 and n-type Al$_{0.6}$Ga$_{0.4}$As second cladding layer 18 located above the inclined faces 11 of the ridge-type mesa 12, the Si added as an n-type impurity functions as a p-type impurity, so that these inclined portions became a p-type inversion layer 20 as shown in FIG. 1.

Using photolithography and selective etching, the portion of the n-type GaAs contact layer 19 other than that located above the top face of the ridge-type mesa 12 was removed. On the thus exposed surface of the n-type Al$_{0.6}$Ga$_{0.4}$As second cladding layer 18 including p-type inversion layer 20, an Si$_3$N$_4$ insulating film 21 was formed by using plasma chemical vapor deposition, photolithography and etching.

Then, the back face of the p-type GaAs substrate 10 was ground so as to decrease the thickness thereof to 100 μm. Thereafter, on the back face of the p-type GaAs substrate 10, a p-sided electrode 22 was formed from Au/AuZn. On the surface of the n-type GaAs contact layer 19 and the Si$_3$N$_4$ insulating film 21, an n-sided electrode 23 was formed from AuGe/Ni. Finally, the wafer was cleaved into a plurality of individual semiconductor laser devices. In this manner, the semiconductor laser device shown in FIG. 1 was obtained.

Figure 2:
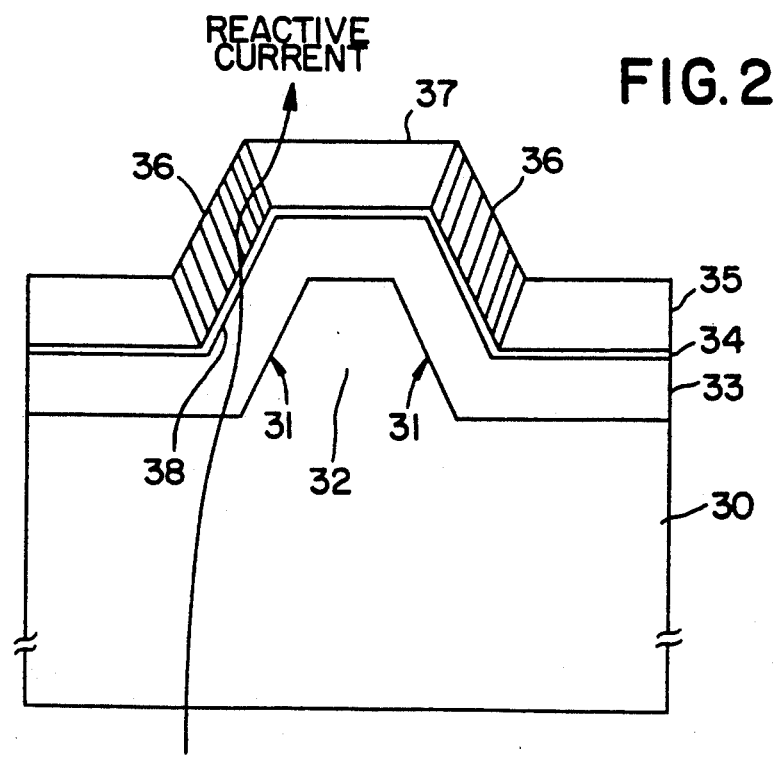
FIG. 2 is a sectional view of a conventional device.

The semiconductor laser device thus produced (with a cavity length of 250 μm) operated at a threshold current of 5 mA. This was far lower than 10 mA, the threshold current of the conventional semiconductor laser device shown in FIG. 2 where only electrons could be confined as described above. In the semiconductor laser device of this example as shown in FIG. 1, electrons with high mobility are effectively confined by the p-type inversion layer 20 formed as the inclined portions of the n-type second cladding layer 18 and n-type second GRIN layer 17, and positive holes with low mobility are effectively confined by the n-type GaAs current blocking layer 13 formed on the entire surface of the p-type GaAs substrate 10 other than the top face of the ridge-type mesa 12. Due to the confinement of both electrons and positive holes, reactive current can be significantly reduced, thereby attaining such a low level of threshold current as described above.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising:
    a semiconductor substrate of a first conductivity type provided with a ridge-type mesa on one surface thereof, the mesa having (n11)A planes (where n is an integer equal to or greater than 1) as its inclined faces;
    a current blocking layer of a second conductivity type formed on the entire part of the one surface of the semiconductor substrate other than the top face of the mesa;
    a first semiconductor layer of the first conductivity type formed from a III-V group compound semiconductor on the entire surface of the current blocking layer and on the top face of the mesa;
    an active layer formed from a III-V group compound semiconductor on the entire surface of the first semiconductor layer; and
    a second semiconductor layer formed on the entire surface of the active layer, the second semiconductor layer having inclined portions located above the inclined faces of the mesa and being made of a III-V group compound semiconductor containing an amphoteric element as an impurity so that the inclined portions of the second semiconductor layer are of the first conductivity type and the other portions of the second semiconductor layer are of the second conductivity type.

2. A semiconductor laser device comprising:
    a semiconductor substrate of a first conductivity type provided with a ridge-type mesa on one surface thereof, the mesa having (n11)A planes (where n is an integer equal to or greater than 1) as its inclined faces;
    a current blocking layer of a second conductivity type formed on the entire part of the one surface of the semiconductor substrate other than the top face of the mesa;
    a first semiconductor layer of the first conductivity type formed from a III-V group compound semiconductor on the entire surface of the current blocking layer and on the top face of the mesa;
    an active layer formed from a III-V group compound semiconductor on the entire surface of the first semiconductor layer; and
    a second semiconductor layer formed on the entire surface of the active layer, the second semiconductor layer having inclined portions located above the inclined faces of the mesa and being made of a III-V group compound semiconductor containing an amphoteric element as an impurity so that the inclined portions of the second semiconductor layer are of the first conductivity type and the other portions of the second semiconductor layer are of the second conductivity type;
    a contact layer of the second conductivity type formed on part of the second semiconductor layer located above the top face of the ridge-type mesa;
    an insulating film formed on the other part of second semiconductor layer;
    a first electrode formed on the surfaces of the contact layer and the insulating film; and
    a second electrode formed on the surface of the semiconductor substrate without the mesa.

3. A semiconductor laser device according to claim 1, which further comprises a third semiconductor layer of the first conductivity type having a GRIN structure between the first semiconductor layer and the active layer, and a fourth semiconductor layer of the second conductivity type having a GRIN structure between the second semiconductor layer and the active layer.

4. A semiconductor laser device according to claim 1, which further comprises a third semiconductor layer of the first conductivity type having a GRIN structure between the first semiconductor layer and the active layer, and a fourth semiconductor layer having a GRIN structure between the second semiconductor layer and the active layer, the fourth semiconductor layer with the GRIN structure having inclined portions located above the inclined faces of the mesa, the inclined portions being of the first conductivity type, and the other portions of the fourth semiconductor layer being of the second conductivity type.

5. A semiconductor laser device according to claim 1, wherein the active layer is of a quantum well structure.

6. A semiconductor laser device according to claim 1, wherein the amphoteric element is a IV group element.

7. A semiconductor laser device according to claim 1, wherein the amphoteric element is Si.

* * * * *